United States Patent [19]

Bingham et al.

[11] Patent Number: 5,574,654
[45] Date of Patent: Nov. 12, 1996

[54] ELECTRICAL PARAMETER ANALYZER

[75] Inventors: Richard P. Bingham, Cranford; Ross M. Ignall, North Brunswick; Paul J. Bernard, Neshanic Station, all of N.J.

[73] Assignee: Dranetz Technologies, Inc., Edison, N.J.

[21] Appl. No.: 201,348

[22] Filed: Feb. 24, 1994

[51] Int. Cl.$^6$ .............................. G01R 1/20; G01R 19/00
[52] U.S. Cl. ..................... 364/487; 324/76.12; 364/481; 364/483
[58] Field of Search .................... 324/76.12; 364/480, 364/481, 483, 484, 486, 487, 579, 580

[56] References Cited

U.S. PATENT DOCUMENTS

| | | |
|---|---|---|
| 4,104,725 | 8/1978 | Rose et al. ............................... 364/487 |
| 4,414,638 | 11/1983 | Talambiras .......................... 364/481 X |
| 4,589,088 | 5/1986 | Place ........................................ 395/775 |
| 4,642,563 | 2/1987 | McEachern et al. ............... 364/486 X |
| 5,151,866 | 9/1992 | Glaser et al. ........................ 364/487 X |
| 5,467,286 | 11/1995 | Pyle et al. ................................. 364/483 |

*Primary Examiner*—Edward R. Cosimano
*Attorney, Agent, or Firm*—Biebel & French

[57] ABSTRACT

An electrical parameter analyzer analyzes samples of electrical power by executing program instructions stored on a PCMCIA compatible program card. The analyzer has a central processing unit including a microprocessor which reads the program card and passes program instructions to an acquisition control processor and an input/output controller, each of which has its own microprocessor. A series of values for a characteristic parameter of the electrical power are generated by the acquisition control processor, and these values are printed under control of the input/output controller upon request of the central processing unit.

13 Claims, 8 Drawing Sheets

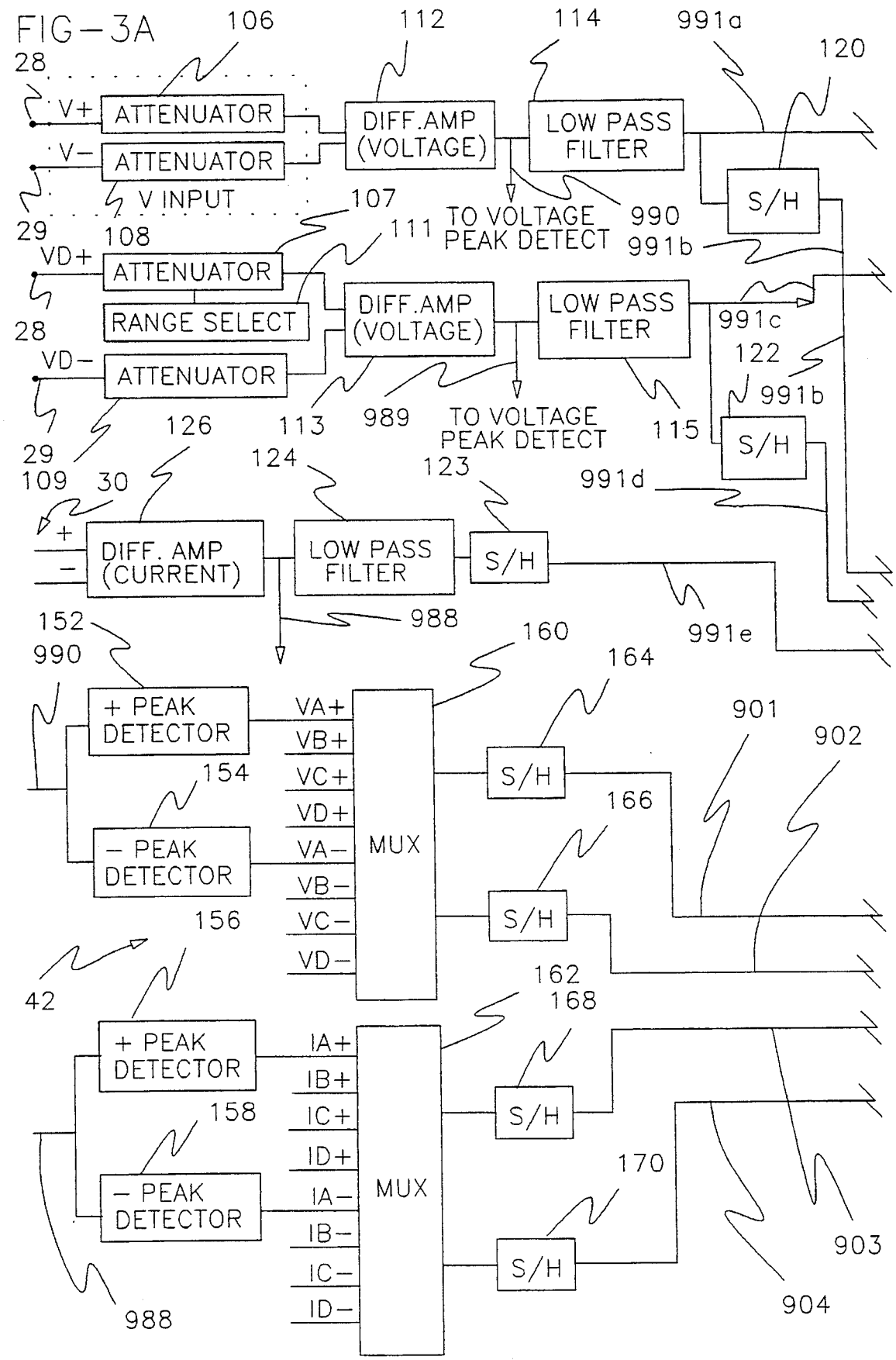

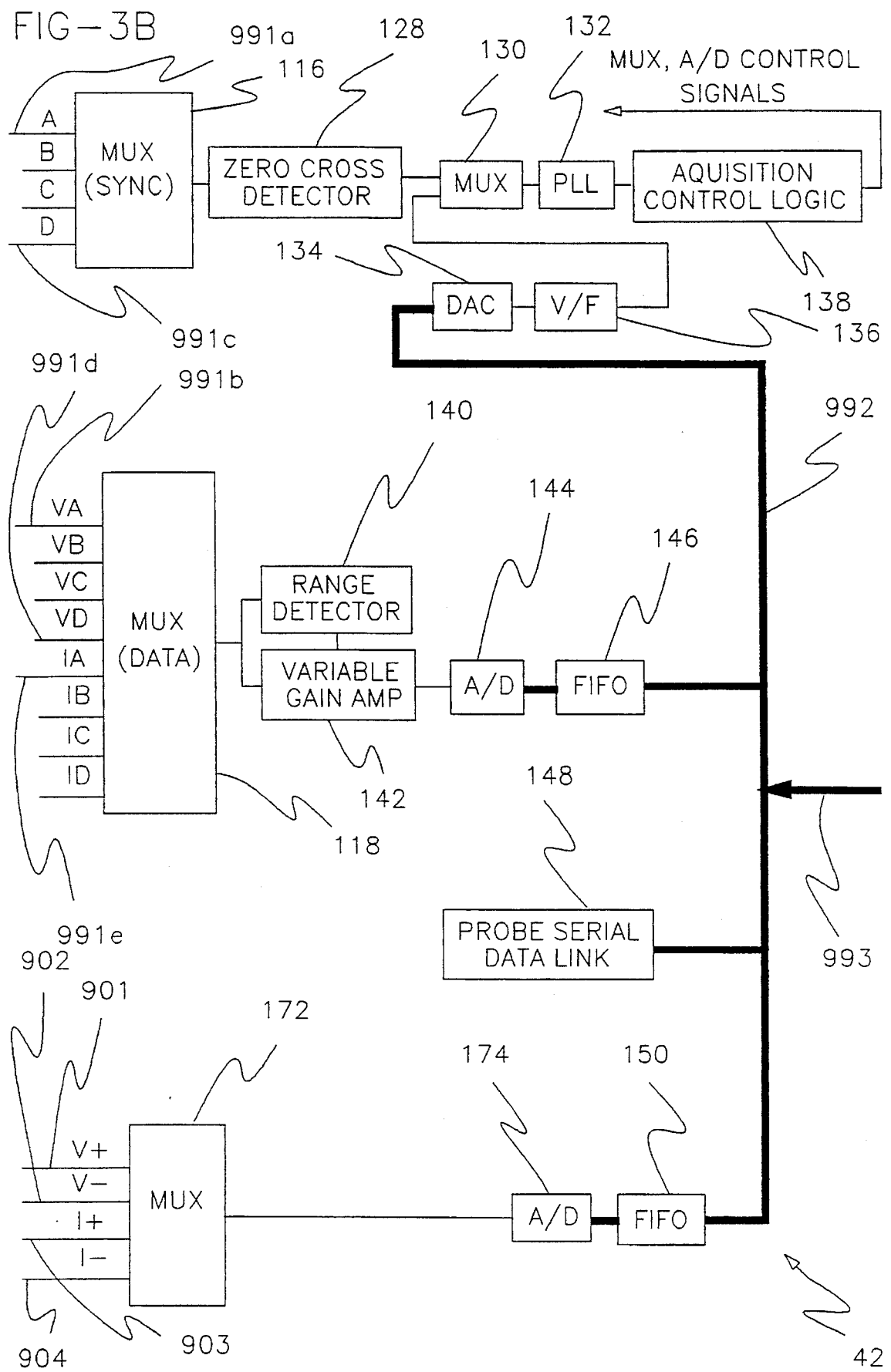

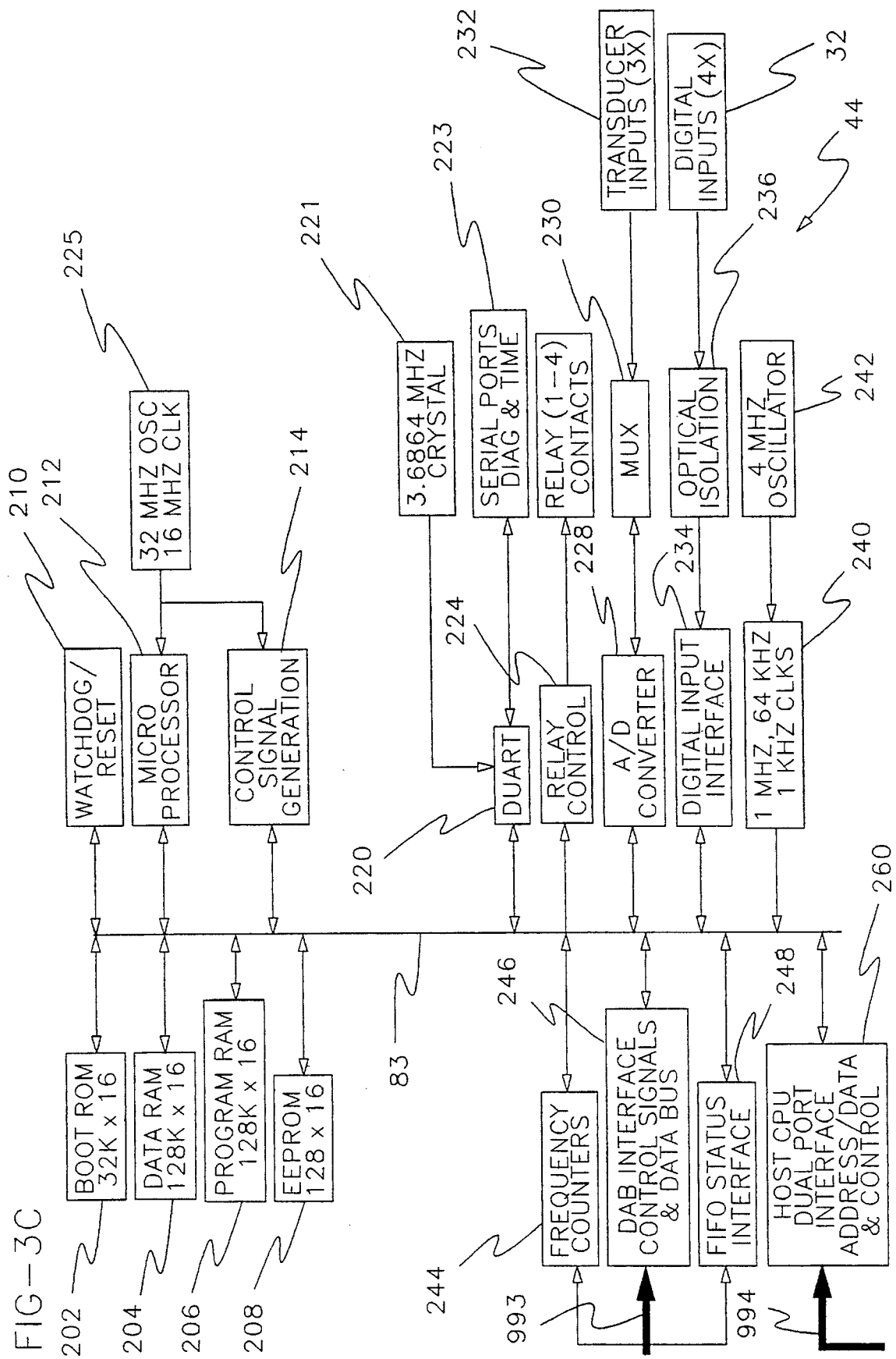

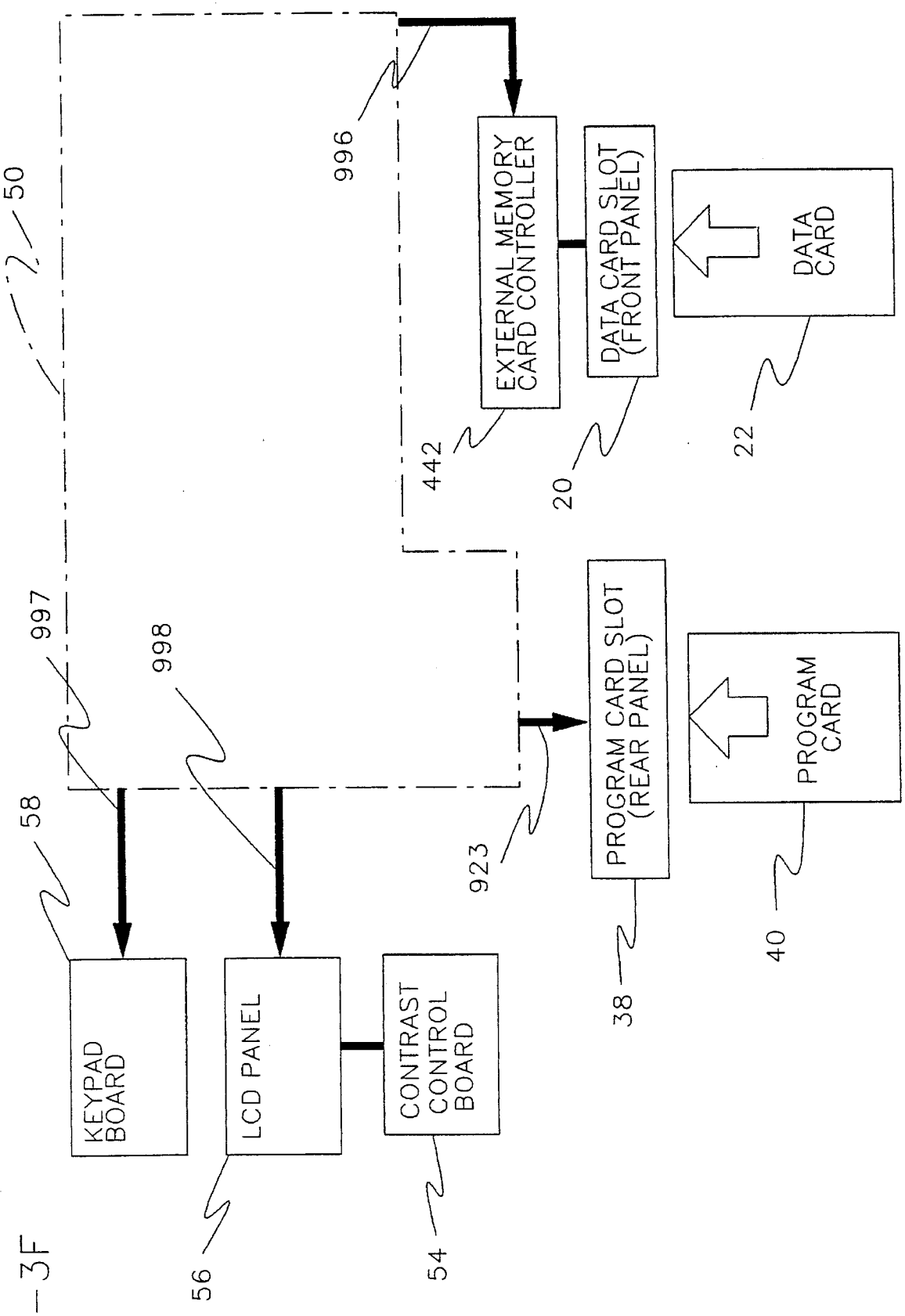

ELECTRICAL PARAMETER ANALYZER

BACKGROUND OF THE INVENTION

This invention relates to apparatus for analyzing the performance of electrical power supply systems. Examples of prior art analysis devices are disclosed in Talambiras, U.S. Pat. No. 4,414,638 and in McEachern et al., U.S. Pat. No. 4,642,563. A typical commercially available device is the Dranetz 8000-2 Energy Analyzer, sold by the assignee of the present application.

The Dranetz 8000-2 and other prior art devices have contained hardware and firmware tailored for specific applications. Thus it has been necessary to purchase one instrument for generation of power quality data and a second instrument for generating power consumption data. Yet a third instrument was required for motor inrush analysis.

Prior art electrical parameter analyzers have used microprocessors for analyzing energy measurement signals provided by suitably configured probes and in some cases have employed memory cards for recording the results in machine readable form. This has enabled them to perform sophisticated power analyses and to store a series of resulting parameters in an efficient and informative manner. However, the single-purpose design of such prior art electrical parameter analyzers has imposed serious economic and operational constraints. Thus there is a need for an improved electrical parameter analyzer which is essentially unlimited in its ability to handle widely divergent energy analysis functions.

SUMMARY OF THE INVENTION

This invention provides an electrical parameter analyzer equipped with means for reading a program card upon which are recorded programming instructions for directing the operation of one or more microprocessors mounted within the analyzer. The program card contains all programming instructions for analyzing a series of parameters characterizing an electrical power supply. It is a feature of this invention that the electrical parameter analyzer is initialized by a "boot" file which is stored in ROM. This file enables the microprocessor to read the program card, perform diagnostics and execute a series of recorded instructions. Without a program card the electrical parameter analyzer is merely a limited capability three-phase watt meter. However, when the instrument is turned on with a program card in place, it is capable of conducting electrical parameter analyses which are limited only by the power of the microprocessor, the imagination of the programmer who programmed the program card and the physical characteristics of the measuring circuitry.

Preferably the present invention utilizes a program card which complies with Personal Computer Memory Card International Association (PCMCIA) standards and has an attribute memory section which is logically and physically separate from the common memory. Program control code for the electrical parameter analyzer is stored in the common memory, while information identifying the hardware and the task to be performed is stored in the attribute memory section.

BRIEF DESCRIPTION OF THE DRAWING

FIGS. 3A–3F are a block diagram of electronic components for the electrical parameter analyzer.

DESCRIPTION OF THE PREFERRED EMBODIMENTS

Figure 1:
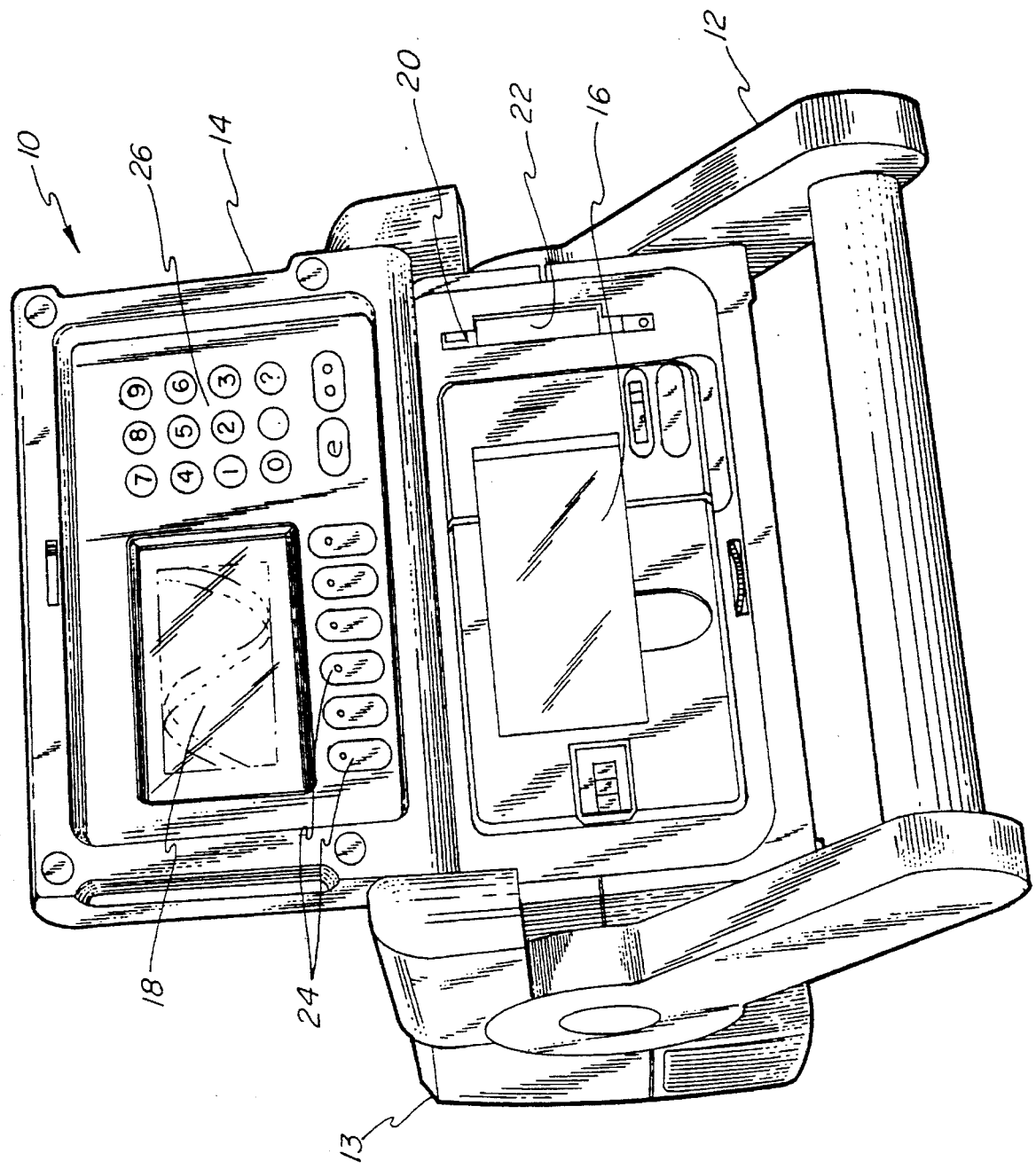
FIG. 1 is a right, front perspective drawing of an electrical parameter analyzer.

The electrical parameter analyzer of the present invention may be packaged in a manner quite similar to the Dranetz 8000-2 energy analyzer. Thus, as illustrated in FIG. 1, the electrical parameter analyzer 10 may comprise a display/keyboard module 14 mounted on a control module 13 which in turn is supported by a cradle-type stand 12. It may be provided with a graphics printer 16 comprising a roll of thermally sensitive paper, a thermal printhead, and an appropriate paper take-up motor.

Electrical parameter analyzer 10 also has a liquid crystal display (LCD) 18 for real time display of electrical signals. Data collected by electrical parameter analyzer 10 may be recorded upon a static RAM data card 22 received within a card slot 20. Data card 22 preferably has a 68 pin connector and complies with PCMCIA standards. Data card slot 20 is equipped with a compatible 68 pin receptacle. Electrical parameter analyzer 10 also has a series of function keys 24 and a numeric keypad 26.

Figure 2:
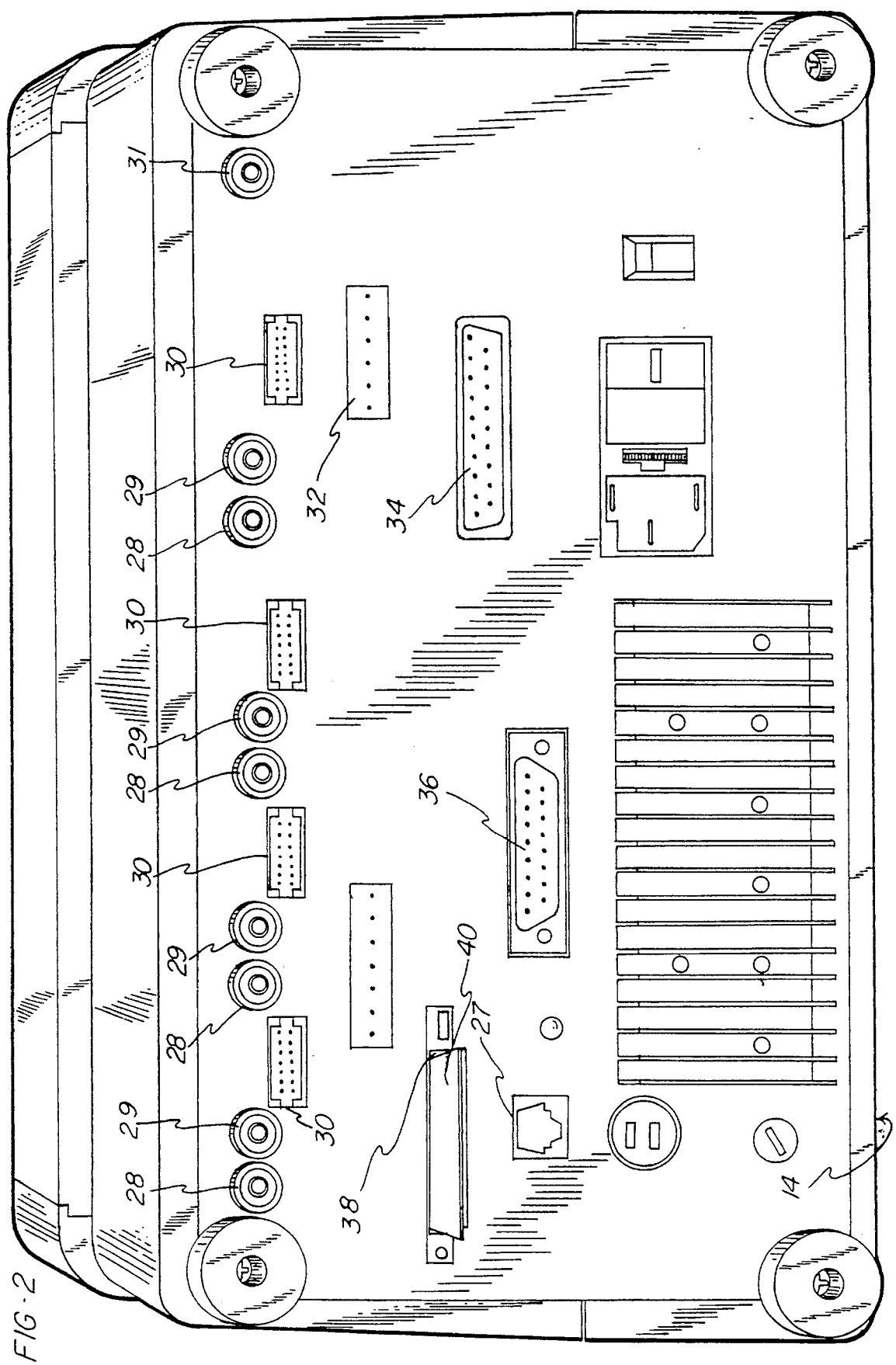
FIG. 2 is a rear view of a control module for the electrical parameter analyzer of FIG. 1.

Referring now to FIG. 2, the input/output connections for the electrical parameter analyzer 10 will be described. Thus, the electrical parameter analyzer may have four positive voltage input terminals 28, four negative voltage terminals 29 and a ground connection terminal 31. Alongside voltage input terminals 28 are four current probe connectors 30. This enables simultaneous monitoring of voltage and current in four analog channels. A digital input connector 32 enables reception of four channels of digital information. There is also a conventional parallel port 34 and a 25 pin RS-232 D serial port 36 for 300–9600 baud communications. Serial port 36 may be connected to a suitable internal or external modem. An optional internal 2400 baud FAX/modem can be accessed via RJIIC jack 27.

A key feature of the invention is program card slot 38 which receives a PCMCIA compatible 68 pin program card 40. Program card 40 contains a solid state common memory and a physically separate solid state attribute memory. The common memory contains program control code for controlling three internal microprocessors 212, 300, 400 (illustrated schematically in FIGS. 3C, 3D and 3E) to analyze electrical signals received via the above-described connectors. The attribute memory contains information such as program card identification, options, purchase date, program card version and general information about the program code stored in the common memory. By way of example, the program code on program card 40 may instruct the internal microprocessors to accept digital inputs from the keypad, interpret those inputs as start/stop intervals for monitoring and recording current and voltage on four input channels, displaying the signals on LCD 18, creating a graphic record thereof on graphics display 16 and creating a machine-readable record thereof on data card 22. A different card may contain program code for analyzing harmonic distortion of voltage, current and power on four input channels and recording the results both graphically and in a text format.

As hereinafter described with reference to FIGS. 3A–3F, each of the microprocessors has an associated ROM containing a stored boot routine. These ROMs initialize the microprocessors and enable them to read the program code on program card 40. All functionality and features of the instrument are in the program card code.

Figure 3D:
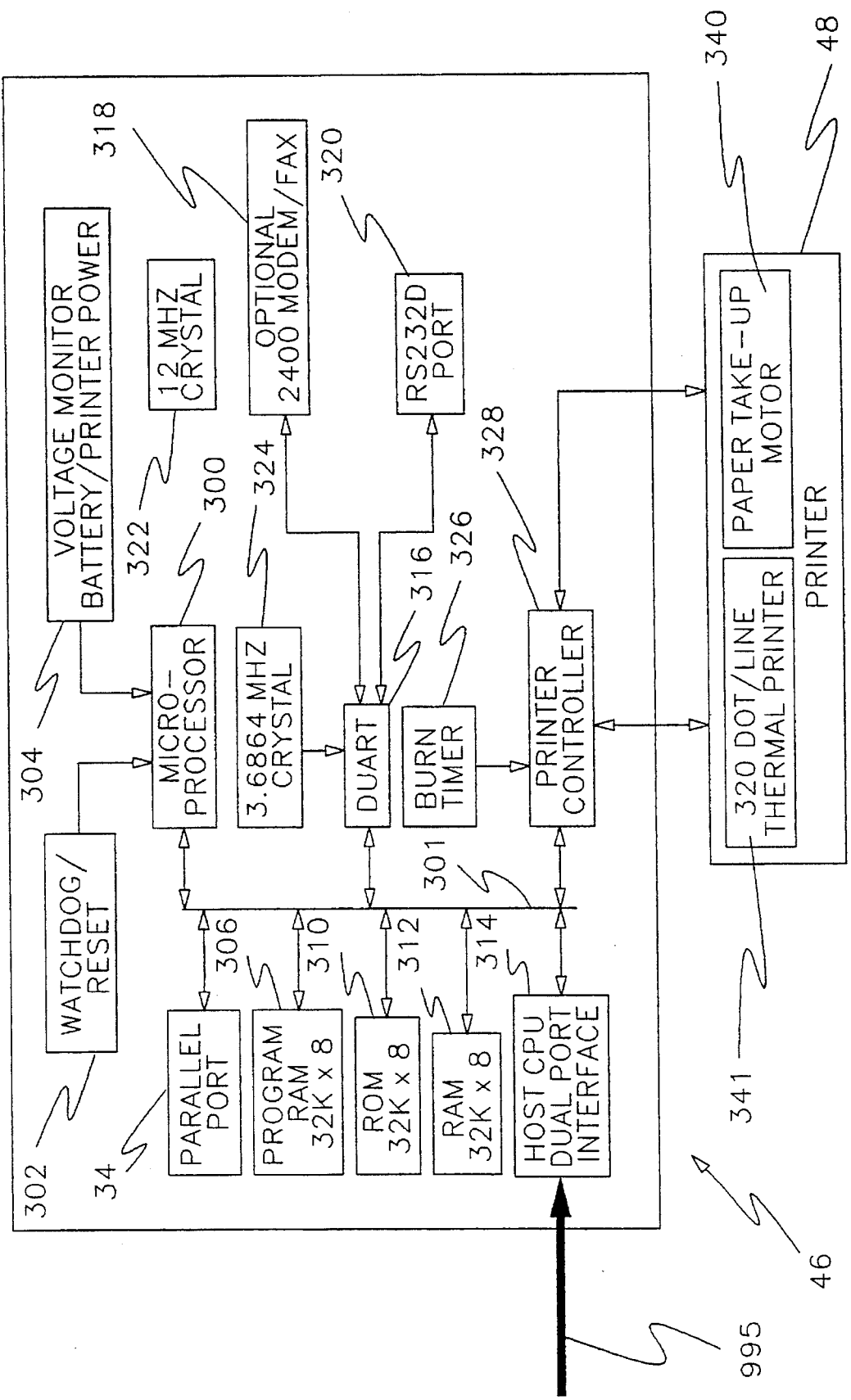
Figure 3E:
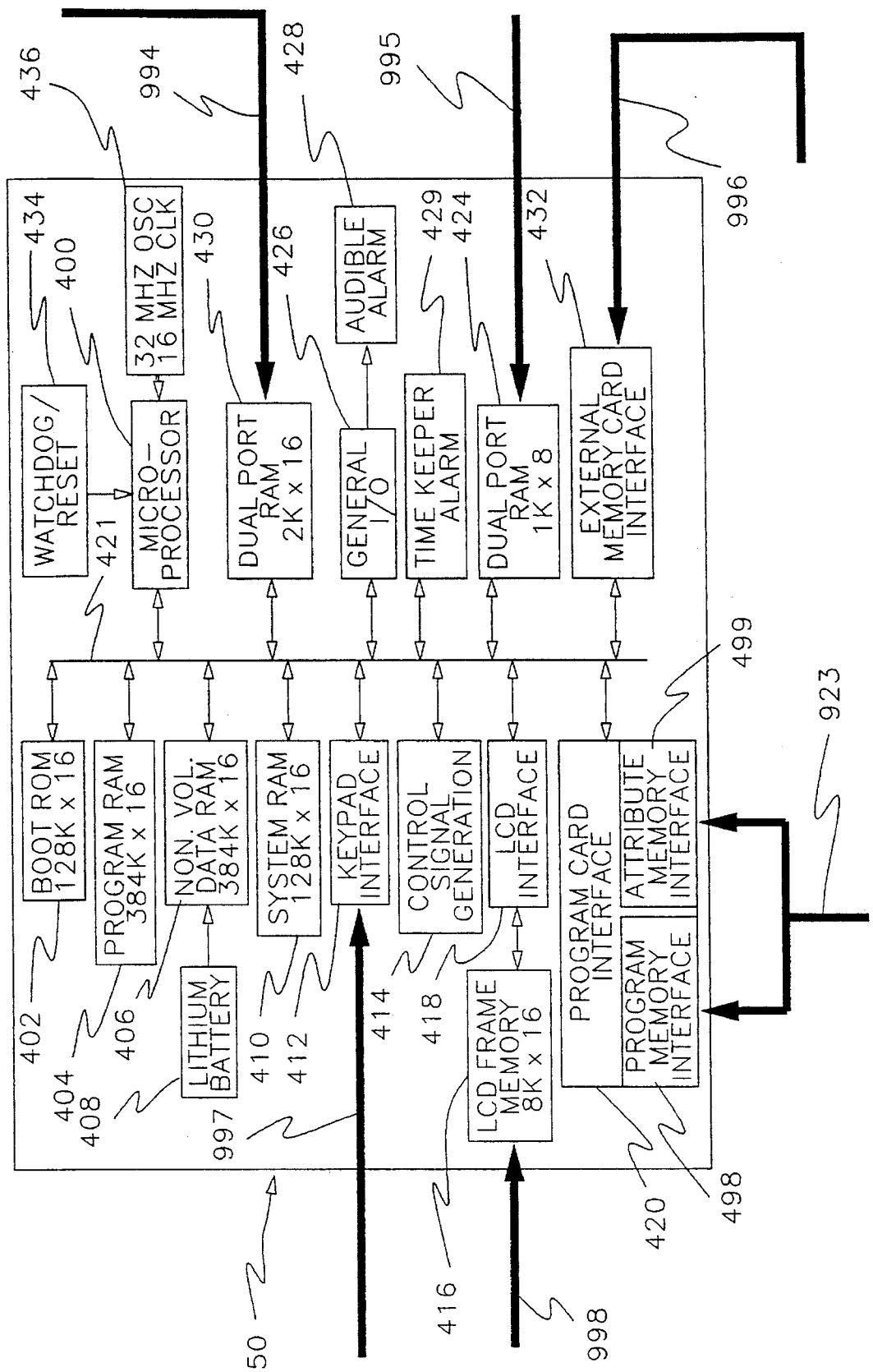

Electrical parameter analyzer 10 has four major subsystems as generally illustrated in block diagram form in FIGS. 3A–3F. They are the data acquisition subsystem 42 (shown partly in FIG. 3A and partly in FIG. 3B), an acquisition control processor (ACP) 44 (FIG. 3C), an I/O controller 46 (FIG. 3D) and a central processing unit 50 (FIG. 3E). An external memory card controller 442, a contrast control board 54, an LCD panel 56 and a keypad board 58 (all illustrated in FIG. 3F) are connected to central processing unit 50. There is also a power supply (not illustrated). Microprocessors 212, 300 and 400 are incorporated within ACP 44, I/O controller 46, and central processing unit 50 respectively. In the preferred embodiment described herein all three microprocessors are supplied by Motorola. Microprocessors 212 and 400 are sold under the designation MC68EC020 while microprocessor 300 is sold under the designation MC68HC11.

Referring now to FIG. 3A, data acquisition subsystem 42 is connected for receiving inputs from the various terminal devices illustrated in FIG. 2. Positive and negative inputs from a current probe connector 30 are supplied to a differential amplifier 126. It will be appreciated that there are four such differential amplifiers 126, only one of which is illustrated. Positive voltage inputs are supplied to three attenuators 106 (only one being illustrated), and a fourth attenuator 107. Negative voltage inputs are supplied to three attenuators 108 (only one being illustrated), as well as to a fourth attenuator 109. A range select circuit 111 is connected between attenuator 107 and its associated attenuator 109. Output signals from attenuator pairs 106,108 are applied to three corresponding differential amplifiers 112 (again, only one being illustrated). The output from each differential amplifier 112 is supplied to a corresponding low pass filter 114 and to a pair of corresponding peak detectors 152,154 via an associated one of three lines 990. Output signals from voltage attenuators 107,109 are similarly applied to a differential amplifier 113 which is connected to a low pass filter 115 and to a pair of peak detectors (not illustrated) identical to peak detectors 152,154 via a line 989. Correspondingly, the output from each differential amplifier 126 is supplied to a low pass filter 124 and to a pair of peak detectors 156,158 via an associated line 988.

Output signals from low pass filters 114,115 and 124 are applied to corresponding sample and hold circuits 120,122, 123 respectively which in turn are connected via lines 991*b*, 991*d* and 991*e* to a multiplexer 118 (FIG. 3B). This provides for simultaneous sampling of all eight input channels. The output signals from low pass filters 114,115 are also applied via a line 991*a*,991*c* to a multiplexer 116 (FIG. 3B) which supplies inputs to a zero crossing detector 128. Voltage and current samples from multiplexer 118 are applied to a range detector 140 and to a variable gain amplifier 142. To summarize, the voltage and current inputs break off and travel in parallel for low frequency sampling as required for power quantity type measurements.

High frequency processing is accomplished by a pair of multiplexers 160,162 and four sample and hold circuits 164, 166, 168 and 170 connected via lines 901–904 to a multiplexer 172. Multiplexer 160 is supplied with inputs from peak detectors 152,154 as well as from similar pairs of peak detectors serving the other above described voltage channels. The four sets of current peak detectors 156,158 are connected to the input side of multiplexer 162. High frequency samples from multiplexer 172 are applied to an A/D converter 174 and thence to a FIFO 150 for application to ACP 44 via a mother board as illustrated schematically by line 993.

Amplified voltage and current signals from variable gain amplifier 142 are applied to an analog-to-digital converter 144 and then are processed by a FIFO 146 for transmission to the ACP 44 by line 993. A probe serial data link 148 also may supply data to ACP 44, again through the mother board. The output from zero crossing detector 128 is applied to a multiplexer 130 for transmission to a phase locked loop 132 which is connected to an acquisition control logic circuit 138. Acquisition control logic 138 provides synchronizing signals for multiplexers 118, 172 and A/D converters 144, 174.

Phase locked loop 132 may be manually controlled by keyboard commands applied via a bus line 992 to DAC 134. A V/F circuit 136 receives the manual control signals in analog form from DAC 134, converts them to frequency adjustments and routes them to the phase locked loop via multiplexer 130.

The main purpose of ACP 44 is to acquire data in real time from data acquisition subsystem 42, process that data, perform calculations thereon, and transfer the results through the mother board via line 993 to the central processing unit 50. The memory section of ACP 44 comprises a boot ROM 202, a data RAM 204, a program RAM 206, and an EEPROM 208. EEPROM 208 stores calibration information for use by the data acquisition subsystem 42.

When electrical parameter analyzer 10 is turned on boot ROM 202 boots microprocessor 212 and passes control to CPU 50. Then, if so instructed by CPU 50, program control instructions for microprocessor 212 are read from CPU 50 and loaded into program RAM 206. Microprocessor 212 then comes under execution control of program RAM 206. If program card 40 is not installed in program card slot 38 at the time of startup, then electrical parameter analyzer 10 operates as a simple three-phase watt meter using a set of minimum logic instructions stored within boot ROM 202.

ACP 44 has a bus 83 which connects ROM 202, RAM 204, RAM 206, EEPROM 208 and microprocessor 212 to a watchdog reset circuit 210, a control signal generation circuit 214, a DUART 220, a relay control 224, an A/D converter 228, a digital input interface 234, frequency counters 244, a databus interface 246, a FIFO status interface 248 and a dual port interface 260. DUART 220 is serviced by a 3.6864 MHz crystal oscillator 221 and by serial port 223. An oscillator 225 generates clock signals for microprocessor 212.

A clock circuit 240 generates 1 MHz, 64 KHz and 1 KHz clocks by counting clock pulses supplied by a 4 MHz oscillator 242. A transducer input block 232 supplies transducer signals to an analog multiplexer 230, which is connected to the input side of the A/D converter 228. Four channels of digital input signals may be applied to terminal block 32 for transfer to an optical isolation circuit 236 which is connected to digital input interface 234. Dual port interface 260 is connected through the mother board via line 994 to a dual port RAM 430 (FIG. 3E) in central processing unit 50.

Referring now to FIG. 3D, I/O controller 46 has a boot ROM 310 which communicates with microprocessor 300. Boot ROM 310 operates in a manner similar to boot ROM 202 in that it initializes microprocessor 300 at startup. Following startup, microprocessor 300 loads program instructions from CPU 50 into a program RAM 306. These instructions are used by microprocessor to control the operations of printer 48. A dual port interface 314 is connected via a line 995 through the mother board to a dual port RAM 424 in CPU 50. Reading of program card 40 is under control of central processing unit 50 which routes appropriate program code to ACP 44 and I/O controller 46 via the mother board and dual port RAMs 424,430 respectively. A bus 301 within I/O controller 46 interconnects microprocessor 300 with ROM 310, program RAM 306, a temporary storage RAM 312, a parallel port 34, a DUART 316 and a printer controller 328.

Printer controller 328 controls printer 48 which in turn comprises a paper takeup motor 340 and a 320 dots-per-line thermal printer 341. A burn timer 326 is connected to printer controller 328 for controlling the operation of thermal printer 330. DUART 316 receives input signals from RS232 port 320 and an optional modem/fax 318. DUART 316 operates under control of a 3.6864 MHz crystal 324. CPU 300 operates under timing control of a 12 MHz crystal 322 and is provided with inputs from a watchdog/reset circuit 302 and a voltage monitor 304.

As illustrated in FIG. 3E, central processing unit 50 has its own boot ROM 402 and program RAM 404 interconnected by a data and address bus 421. These units operate in a manner similar to the above-described boot ROM and program RAM units of ACP 44 and I/O controller 46 so as to control the operation of microprocessor 400. Central processing unit 50 also includes dual port RAMs 424, 430 which are mentioned above, as well as a non-volatile RAM 406 and a system RAM 410. A lithium battery 408 powers non-volatile RAM 406.

Other elements of central processing unit 50 include a watchdog/reset circuit 434, a 16 MHz clock 436, a general I/O circuit 426, an audible alarm 428, a time keeper alarm 429.and a control signal generator 414. An LCD interface 418 controls LCD frame memory 416 which in turn services LCD panel 56 (FIG. 3F) via a line 998. A keypad interface 412 communicates with keypad board 58 via a line 997.

A program card interface 420 connects program card 40, received in program card slot 38 to bus 421 via a line 923. Control signal generator 414 operates under control of microprocessor 400 for selectively causing program card interface 420 to address either common memory 498 or attribute memory 499 of program card 40. External memory card interface 432 connects bus 421 to an external memory card controller 422 through a bus 996. External memory card controller 422 accesses digitized data stored on data card 22, received in data card slot 20.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. Apparatus for analyzing an electrical power system comprising:

(a) Data acquisition means for sampling electrical power being supplied by said electrical power system and generating a sample stream corresponding thereto, (b) an acquisition control processor including a random access memory for storing a program containing instructions for processing said sample stream, and a first microprocessor connected to said random access memory and to said data acquisition means for processing said sample stream in accordance with said instructions;

(c) a second microprocessor connected for providing said instructions to said random access memory;

(d) a removable program card provided with a solid state memory logically organized into a common memory and an attribute memory, said instructions being stored in said common memory, and identifying information being stored in said attribute memory, (e) a program card interface configured for receiving said program card and operative under control of said second microprocessor to provide a copy of said instructions for use as aforesaid, and (f) a startup ROM containing a boot code for booting said second microprocessor, logic instructions sufficient for enabling said second microprocessor to cause operation of said apparatus as a three-phase wattmeter and other instructions enabling said second microprocessor to control the operation of said program card interface.

2. Apparatus according to claim 1 wherein said attribute memory is structured to contain digitally encoded equipment identifying information and digitally encoded program identifying information.

3. Method of analyzing an electrical power system comprising the steps of:

(1) storing a series of program instructions in non-volatile digital form upon a digital storage medium;

(2) causing a second microprocessor to read said instructions from said digital storage medium and store a copy thereof in a random access memory;

(3) sampling electrical power being supplied by said electrical power system and generating a sample stream corresponding thereto; and (4) causing a first microprocessor to access said copy of said instructions in said random access memory and analyze said sample stream in accordance therewith.

4. Method according to claim 3 further comprising the steps of:

(6) storing a boot file in a read only memory;

(7) reading said boot file from said read only memory; and (8) utilizing said boot file for performing said initializing step.

5. Method according to claim 4 further comprising the step of making a printed record of said series of values.

6. Method of analyzing an electrical power system comprising the steps of:

(1) storing a series of program instructions in digital form upon a machine readable program card;

(2) using a central processing unit to read said program instructions from said program card, (3) passing a first portion of said program instructions from said central processing unit to an acquisition control processor, (4) passing a second portion of said program instructions from said central processing unit to an input/output controller, (5) sampling electrical power being supplied by said electrical power system and generating a sample stream corresponding thereto;

(6) causing said acquisition control processor to generate a series of values for a characteristic parameter of said electrical power by executing said first portion of said program instructions upon said sample stream; and (7) causing said input/output controller to cause a printed record of said series of values to be made by executing said second portion of said program instructions.

7. Method according to claim 6 further comprising the steps of:

(8) storing boot instructions for said central processing unit, said acquisition control unit and said input/output controller in a read only memory means;

(9) reading said boot instructions from said read only memory means; and

(10) using said boot instructions to initialize said central processing unit, said acquisition control processor and said input/output controller.

8. Apparatus for analyzing an electrical power system comprising:

(a) a data acquisition unit including input connectors for connection to said power system, and voltage and current samplers for sampling electrical power received by said input terminals from said electrical power system and generating a sample stream containing samples thereof;

(b) an electrical bus connected for receiving said sample stream from said data acquisition unit;

(c) an acquisition control processor including a first microprocessor responsive to an acquisition control program for processing said sample stream and a first random access memory for storing said acquisition control program, said acquisition control processor being connected to said electrical bus for receiving said sample stream and said acquisition control program;

(d) a program card interface configured for receiving a program card carrying said acquisition control program and responsive to reading control signals for reading said acquisition control program;

(e) a connecting line connected to said program card interface for delivering said reading control signals thereto and receiving said acquisition control program therefrom; and (f) a central processing unit connected to said connecting line and to said electrical bus, said central processing unit including a second microprocessor organized for generating said reading control signals, causing said reading control signals to be placed on said connecting line for delivery to said program card interface, and relaying said acquisition control program from said connecting line to said electrical bus for delivery to said acquisition control unit.

9. Apparatus according to claim 8 wherein said data acquisition unit comprises peak detection means for detecting voltage and current peaks in said electrical power, and means for providing said voltage and current peaks to said voltage and current samplers.

10. Apparatus according to claim 9 wherein said data acquisition unit comprises phase locked loop means for synchronizing the generation of said sample stream.

11. Apparatus according to claim 8, said central processing unit comprising a second random access memory for storing a CPU control program, means for transferring a copy of said CPU control program into said second random access memory from a program card which has been received as aforesaid in said program card interface, and means operatively connecting said second random access memory to said second microprocessor.

12. Apparatus according to claim 11, said acquisition control processor being connected for delivering processed data to said electrical bus, said apparatus further comprising an Input/Output controller connected for receiving said processed data from said electrical bus, and a printer operating under control of said Input/Output controller for printing a copy of said processed data.

13. Apparatus according to claim 12, said central processing unit comprising means for transferring a copy of an I/0 control program from said program card interface to said electrical bus, and said Input/Output controller comprising a third random access memory for storing said copy of said I/0 control program and a third microprocessor connected to said third random access memory for controlling said printer pursuant to said I/0 control program.

\* \* \* \* \*